(12) United States Patent
Oh et al.

(10) Patent No.: US 7,833,075 B2
(45) Date of Patent: Nov. 16, 2010

(54) METHOD FOR FORMING METAL LINE AND METHOD FOR MANUFACTURING DISPLAY SUBSTRATE BY USING THE SAME

(75) Inventors: Min-Seok Oh, Yongin-si (KR); Sang-Gab Kim, Seoul (KR); Shin-Il Choi, Seoul (KR); Hong-Kee Chin, Suwon-si (KR); Yu-Gwang Jeong, Yongin-si (KR); Seung-Ha Choi, Shiheung-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 11/862,837

(22) Filed: Sep. 27, 2007

(65) Prior Publication Data
US 2008/0081534 A1 Apr. 3, 2008

(30) Foreign Application Priority Data
Sep. 29, 2006 (KR) .................. 10-2006-0095442

(51) Int. Cl.
*H01J 1/62* (2006.01)
*H01J 63/04* (2006.01)
*H01J 9/24* (2006.01)

(52) U.S. Cl. .............. 445/24; 445/23; 445/25; 445/1; 313/495; 313/497; 313/483

(58) Field of Classification Search ............. None
See application file for complete search history.

(56) References Cited

U.S. PATENT DOCUMENTS

| 6,258,723 | B1* | 7/2001 | Takeichi et al. | 438/706 |
| 6,383,942 | B1* | 5/2002 | Narita et al. | 438/720 |
| 7,226,867 | B2* | 6/2007 | Son et al. | 438/706 |
| 7,235,810 | B1* | 6/2007 | Yamazaki et al. | 257/59 |
| 2008/0087633 | A1* | 4/2008 | Oh et al. | 216/41 |

FOREIGN PATENT DOCUMENTS

| JP | 2002-072230 | 3/2002 |
| KR | 10-2004-0017158 | 2/2004 |

\* cited by examiner

*Primary Examiner*—Nimeshkumar D Patel
*Assistant Examiner*—Natalie K Walford
(74) *Attorney, Agent, or Firm*—H.C. Park & Associates, PLC (57) ABSTRACT

In a method for forming a metal line, a first metal layer and a second metal layer are deposited on a substrate. The first metal layer includes aluminum, and the second metal layer includes molybdenum. A photoresist pattern having a line-shape is formed on the second metal layer. The second metal layer is etched with a chlorine-containing etching gas using the photoresist pattern as a mask. The first metal layer is then etched with a mixture of a chlorine-containing gas and nitrogen gas and/or a mixture of a chlorine-containing gas and argon gas as an etching gas. Impurities such as chlorine ions are removed from the base substrate after etching the first metal layer with a fluorine-containing gas, hydrogen gas, or water vapor. A method for manufacturing a display substrate is disclosed using the method for forming a metal line to form source, drain, and gate electrodes and gate lines.

17 Claims, 12 Drawing Sheets

<SEM_1>

FIG. 4B

<SEM_2>

METHOD FOR FORMING METAL LINE AND METHOD FOR MANUFACTURING DISPLAY SUBSTRATE BY USING THE SAME

CROSS REFERENCE TO RELATED APPLICATION

This application claims priority from and the benefit of Korean Patent Application No. 10-2006-0095442, filed on Sep. 29, 2006, which is hereby incorporated by reference for all purposes as if fully set forth herein.

BACKGROUND OF THE INVENTION

1. Field of the Invention

The present invention relates to a method for forming a metal line and a method for manufacturing a display substrate by using the method for forming a metal line. More particularly, the present invention relates to a method for forming a metal line having low resistance and improved resistance to corrosion and a method for manufacturing a display substrate by using the method for forming a metal line.

2. Discussion of the Background

In general, a liquid crystal display (LCD) apparatus includes a display substrate, an opposite substrate and a liquid crystal layer interposed between the display substrate and the opposite substrate. The display substrate includes a plurality of gate lines, a plurality of data lines crossing with the gate lines, a plurality of switching elements each electrically connected to a gate line and a data line, and a plurality of pixel electrodes each electrically connected to a switching element.

Recently, as a commercially available display apparatus is increasing in size and producing a higher resolution, a resistance-capacitance (RC) delay of a metal line formed on the display substrate may increase. In order to reduce the RC delay, the metal line may include aluminum, which has a relatively low resistance.

However, when the metal line includes aluminum, a defective ratio may increase. Particularly, contact resistance between the metal layer including aluminum and a metal layer including a different metal may be relatively high. Furthermore, aluminum ions may be easily diffused to a silicon layer.

In order to form a fine metal line, a dry-etching process may be used. However, an etchant used in the dry-etching process may damage a metal line formed of aluminum.

SUMMARY OF THE INVENTION

This invention provides a method for forming a metal line having low resistance and improved resistance to corrosion.

This invention also provides a method for manufacturing a display substrate by using the above-mentioned method for forming a metal line.

Additional features of the invention will be set forth in the description which follows, and in part will be apparent from the description, or may be learned by practice of the invention.

The present invention discloses a method for forming a metal line. The method includes forming a first metal layer on a base substrate, the first metal layer comprising aluminum and/or aluminum alloy, forming a second metal layer on the first metal layer, the second metal layer comprising molybdenum and/or molybdenum alloy, forming a photoresist pattern having a line-shape on the second metal layer, etching the second metal layer with a first etching gas by using the photoresist pattern as a mask, the first etching gas comprising a mixture of a chlorine-containing gas and oxygen gas, and etching the first metal layer with a second etching gas by using the photoresist pattern as a mask, the second etching gas comprising at least one of a mixture of a chlorine-containing gas and a nitrogen gas, or a mixture of a chlorine-containing gas and an argon gas.

The present invention also discloses a method for manufacturing a display substrate. The method includes forming a gate insulation layer on a base substrate having a gate pattern, the gate pattern comprising a gate line and a gate electrode of a switching element, forming a source metal layer comprising a first metal layer on the gate insulation layer, the first metal layer comprising aluminum and/or aluminum alloy, etching the source metal layer with an etching gas to form a source electrode and a drain electrode of the switching element, forming a protection insulation layer comprising a contact hole exposing a portion of the drain electrode, and forming a pixel electrode contacting the drain electrode through the contact hole. Further, the etching gas comprises at least one of a mixture of a chlorine-containing gas and a nitrogen gas, or a mixture of a chlorine-containing gas and an argon gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method for Forming a Metal Line

FIG. 1A, FIG. 1B, FIG. 1C and FIG. 1D are cross-sectional views illustrating a method for forming a metal line according to an exemplary embodiment of the present invention.

Figure 2:
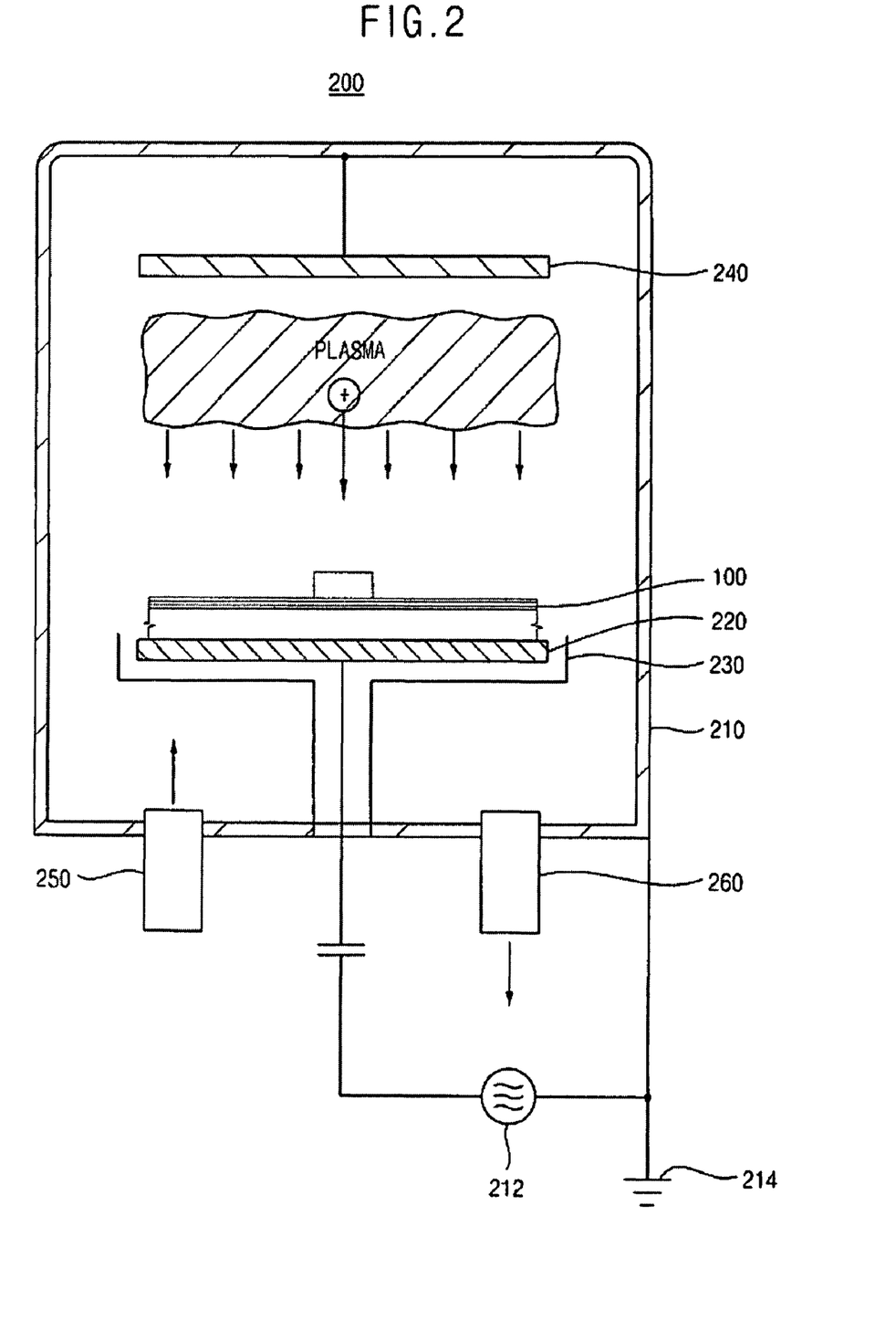
FIG. 2 is a schematic view illustrating a reactive ion etcher (RIE) used in the method for forming a metal line according to an exemplary embodiment of the present invention.

FIG. 2 is a schematic view illustrating a reactive ion etcher (RIE) used in the method for forming a metal line.

Figure 1A:
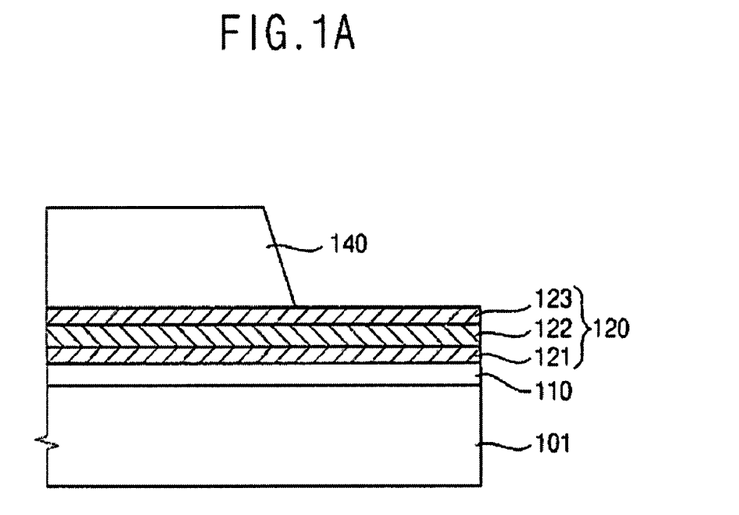
FIG. 1A, FIG. 1B, FIG. 1C and FIG. 1D are cross-sectional views illustrating a method for forming a metal line according to an exemplary embodiment of the present invention.

Referring to FIG. 1A, an insulation layer 110 is formed on a base substrate 101. A metal line layer 120 is formed on the insulation layer 110.

The metal line layer 120 includes a first metal layer 122, a second metal layer 123 and a third layer 121. The third layer 121 is formed on the insulation layer 110. The first metal layer 122 is formed on the third layer 121, and the second layer 123 is formed on the first metal layer 122. The third layer 121 may include, for example, molybdenum (Mo), and/or an alloy thereof. The first metal layer 122 may include a metal having a relatively low resistance, for example, aluminum (Al), and/or an alloy thereof. The second layer 123 may include, for example, Mo, and/or an alloy thereof.

A photoresist layer is formed on the metal line layer 120 and then patterned to form a photoresist pattern 140 corresponding to a pattern of a metal line. The metal line layer 120 is etched through a dry-etching process by using the photoresist pattern 140 as a mask.

The dry-etching process, a treatment process, and an ashing process may be performed using the RIE shown in FIG. 2. The dry-etching process, the treatment process, and the ashing process will be explained in more detail below.

Referring to FIG. 2, the RIE 200 includes a vacuum chamber 210 in which an object substrate 100 is etched, a radio frequency (RF) generator 212, and a power supplier 214. The vacuum chamber 210 includes a lower electrode 220, a ground-shielding portion 230, an upper electrode 240, a gas supplier 250, and a vacuum pump 260.

The lower electrode 220 is disposed on the ground-shielding portion 230, and is electrically connected to the RF generator 212 to receive RF power. The object substrate 100 is disposed on the lower electrode 220. The upper electrode 240 is disposed on the lower electrode 220, and is electrically connected to the vacuum chamber 210. The vacuum chamber 210 may serve as the upper electrode 240. The lower electrode 220 may serve as a cathode, and the upper electrode 240 may serve as an anode.

The gas supplier 250 supplies gas to be used for the dry-etching process, the ashing process, and the treatment process into the vacuum chamber 210. The gas supplied into the vacuum chamber 210 may be plasma-discharged by the RF power.

The vacuum pump 260 exhausts the gas from the vacuum chamber 210 so that the vacuum chamber 210 may maintain a vacuum.

Hereinafter, the dry-etching process, the ashing process and the treatment process will be explained more fully with reference to FIG. 1A, FIG. 1B, FIG. 1C, FIG. 1D, and FIG. 2. For the purpose of the explanation, the object substrate 100 shown in FIG. 2 shall be the base substrate 101, including the metal line layer 120 and the photoresist pattern 140 formed on the base substrate 101, as shown in FIG. 1A, FIG. 1B, FIG. 1C, and FIG. 1D.

Referring to FIG. 1A and FIG. 2, the base substrate 101 having the photoresist pattern 140 is disposed on the lower electrode 220 in the vacuum chamber 210.

An oxidized layer formed on a surface of the second layer 123 of the metal line layer 120 is removed through a dry-etching process with the RIE set in a first condition. In the first condition, a chamber pressure may be about 15 mT, a source power may be about 2,000 W, and an etching gas includes boron trichloride ($BCl_3$) gas.

Figure 1B:
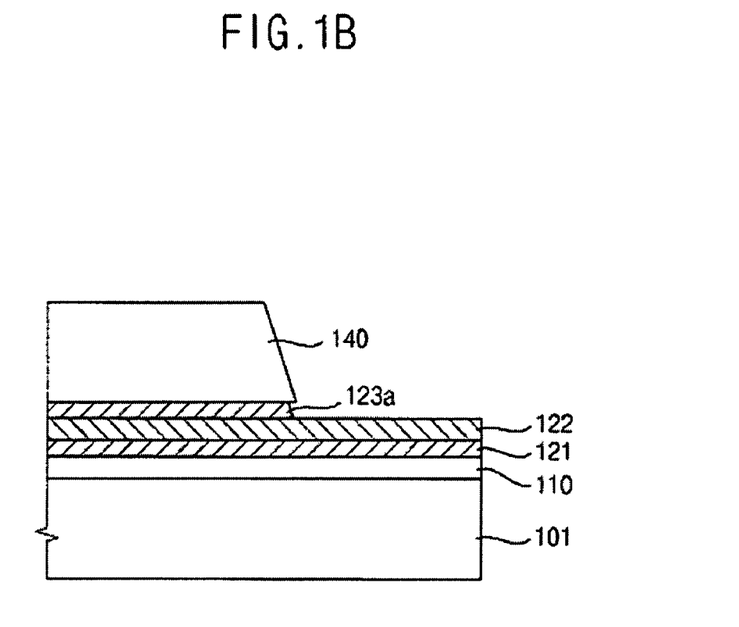

Referring to FIG. 1B and FIG. 2, after the oxidized layer of the second layer 123 is removed, the second layer 123 is etched with the RIE set in a second condition. In the second condition, a chamber pressure may be about 15 mT, a source power may be about 1,500 W, and etching gas includes a mixture of chlorine ($Cl_2$) gas and oxygen ($O_2$) gas. A volume ratio of the chlorine gas to the oxygen gas may be about 25:50. The second layer 123 is etched in the second condition to form an upper pattern 123a.

Figure 1C:
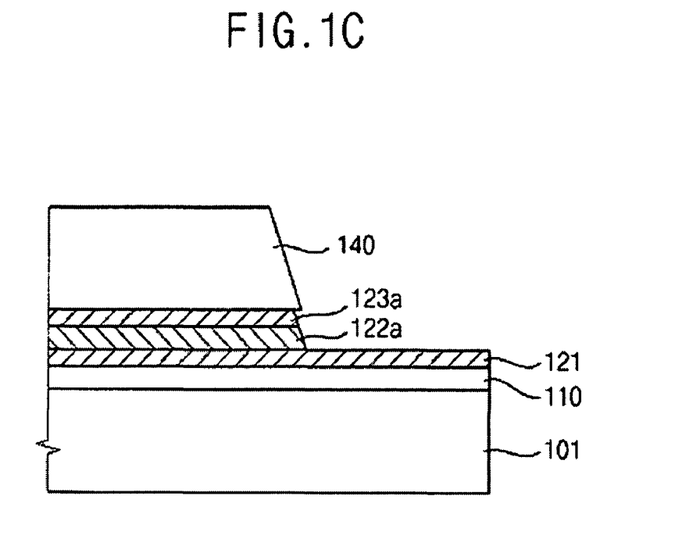

Referring to FIG. 1C and FIG. 2, after the second layer 123 is etched to form the upper pattern 123a, an oxidized layer formed on a surface of the first metal layer 122 is removed with the RIE set in a third condition. In the third condition, a chamber pressure may be about 15 mT, a source power may be about 2,000 W, and an etching gas includes a mixture of chlorine ($Cl_2$) gas and boron trichloride gas ($BCl_3$). A volume ratio of the chlorine gas to the boron trichloride gas may be about 20:100.

After the oxidized layer of the first metal layer 122 is removed, the first metal layer 122 is etched with the RIE set in a fourth condition. In the fourth condition, a chamber pressure may be about 10 mT to about 30 mT, a source power may be about 1,000 W to about 2,000 W, a bias power may be about 0 W to about 800 W, and an etching gas includes a mixture of a chlorine-containing gas, for example, chlorine gas or hydrogen chloride (HCl) gas, and argon (Ar) gas, or a mixture of chlorine gas and nitrogen ($N_2$) gas. A source power density with respect to a surface area of an electrode may be about 0.7 $W/cm^2$ to about 1.8 $W/cm^2$. A bias power density with respect to a surface area of an electrode may be about 0.7 $W/cm^2$ to about 1.8 $W/cm^2$. A volume ratio of the argon gas or the nitrogen gas to the chlorine gas may be about 0.50 to about 1.50.

The first metal layer 122 is etched in the fourth condition to form a low-resistance pattern 122a. The first metal layer 122 includes aluminum and/or an alloy thereof, and the fourth condition may improve an etching uniformity of the first metal layer 122.

The etching uniformity represents a uniformity of an amount of the first metal layer 122 removed through the etching process. Particularly, the etching uniformity may be evaluated by measuring a surface profile of the first metal layer 122 after the etching process.

To evaluate the etching uniformity of the first metal layer 122, an aluminum layer having a thickness of about 4,000 Å was formed on a substrate, and then etched using various mixtures. The obtained results are illustrated in Table 1.

TABLE 1

| | Etching Gas | | |
|---|---|---|---|
| | $Cl_2/BCl_3$ (a volume ratio of 60:90) | $Cl_2/N_2$ (a volume ratio of 60:60) | $Cl_2/Ar$ (a volume ratio of 60:60) |
| Etching Rate (Å/min) | 4,621 | 3,744 | 3,726 |
| Uniformity (%) | 19.5 | 10.8 | 11.2 |

Referring to Table 1, the uniformity value represents a distribution with respect to an average value of an etching amount. Thus, as the uniformity value decreases, the etching uniformity increases.

The etching uniformity of the aluminum layer etched using a mixture of chlorine gas and nitrogen gas or a mixture of chlorine gas and argon gas is greater than the etching uniformity of the aluminum layer etched using a mixture of chlorine gas and boron trichloride gas.

Thus, when the first metal layer 122 having aluminum is etched using the mixture of chlorine gas and nitrogen gas or the mixture of chlorine gas and argon gas, the etching uniformity of the first metal layer 122 may be improved.

Figure 1D:
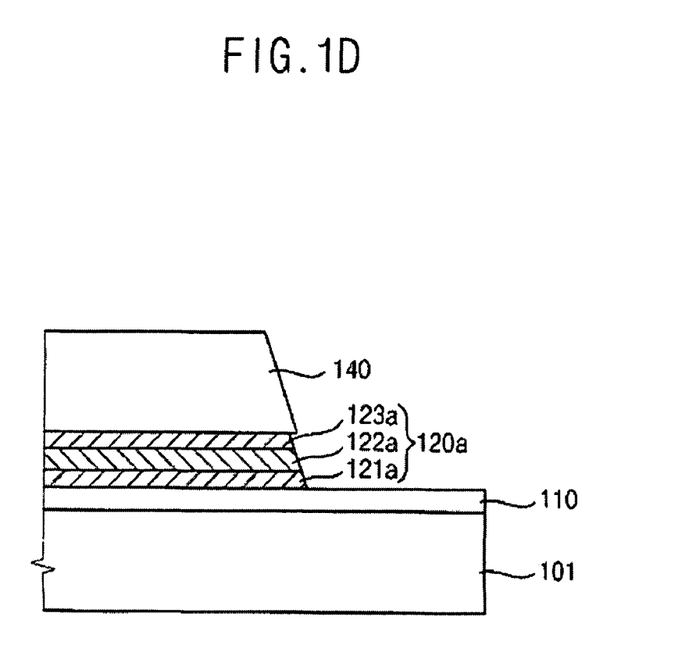

Referring to FIG. 1D and FIG. 2, after the first metal layer 122 is etched, the third layer 121 is etched with the RIE set in a fifth condition. In the fifth condition, a chamber pressure may be about 15 mT and an etching gas includes a mixture of chlorine gas and oxygen gas. A volume ratio of the chlorine gas to the oxygen gas may be about 50:200. The third layer 121 is etched to form a lower pattern 121a.

As a result, a low-resistance metal line 120a is formed on the base substrate 101.

Since the etching gas includes chlorine gas, chlorine ions may remain on the base substrate 101 after the dry-etching process. When chlorine ions are exposed to the atmosphere, they may react with moisture in the atmosphere to form hydrogen chloride. Hydrogen chloride may cause the low-resistance pattern 122a to corrode and form a line defect.

Thus, a treatment process may be performed to remove the chlorine ion remaining on the base substrate 101 after the dry-etching process. A hydrogen gas and/or water vapor may be supplied to the vacuum chamber 210 for the treatment process.

The hydrogen in the hydrogen gas and/or the water vapor supplied to the vacuum chamber 210 may be dissociated to generate hydrogen ions (H+). The hydrogen ions then react with the chloride ions remaining on the base substrate 101 to form hydrogen chloride (HCl). The hydrogen chloride in the vacuum chamber 210 is vaporized by an equilibrium steam pressure. The vaporized hydrogen chloride is exhausted from the vacuum chamber 210 by the vacuum pump 260. Thus, a risk of low-resistance pattern 122a corrosion may be reduced.

Alternatively, the treatment process may be performed using a fluorine-containing gas instead of the hydrogen gas or the water vapor.

Particularly, the fluorine-containing gas supplied to the vacuum chamber 210 may be dissociated by radio frequency (RF) power to generate a fluorine radical. The fluorine radical has a reactivity greater than that of a chlorine ion, and fluorine radicals may be substituted for the chlorine ions remaining on the low-resistance pattern 122a. Thus, a corrosion protection layer including aluminum fluoride (AlF) is formed on a surface of the low-resistance pattern 122a to reduce the risk of low-resistance pattern 122a corrosion.

An ashing process may be performed to remove the photoresist pattern 140 by supplying oxygen gas to the vacuum chamber 210 after or before the treatment process described above.

Figure 3A:
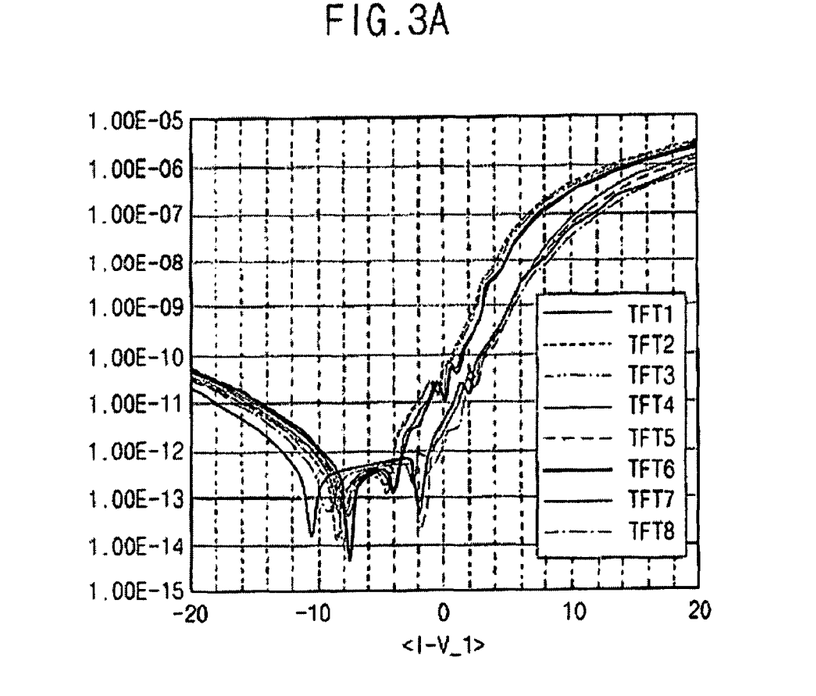
FIG. 3A shows current-voltage relationships for thin-film transistors manufactured using a conventional method.
Figure 3B:
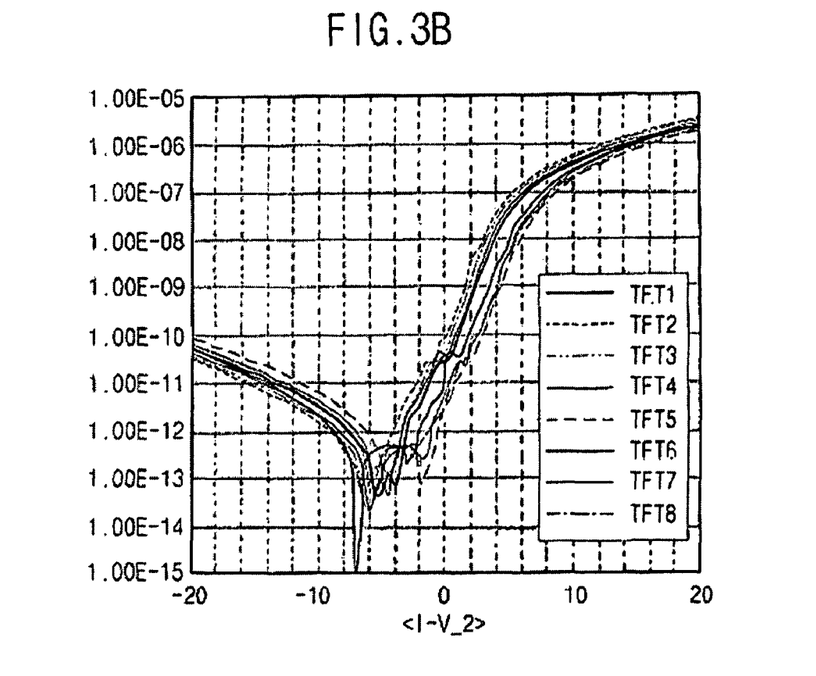
FIG. 3B illustrates current-voltage relationships for thin-film transistors manufactured using a method for forming a metal line according to an exemplary embodiment of the present invention.

FIG. 3A and FIG. 3B are graphs showing currents and voltages of thin-film transistors.

FIG. 3A shows current-voltage relationships for thin-film transistors TFT1, TFT2, TFT3, TFT4, TFT5, TFT6, TFT7 and TFT8 manufactured using a conventional method. First metal layers 122 of the TFTs were etched using a mixture of chlorine gas and boron trichloride gas as an etching gas. FIG. 3B illustrates current-voltage relationships for thin-film transistors TFT1, TFT2, TFT3, TFT4, TFT5, TFT6, TFT7 and TFT8 manufactured using a method for forming a metal line according to an exemplary embodiment of the present invention. First metal layers 122 of the TFTs were etched using a mixture of chlorine gas and nitrogen gas as an etching gas.

Referring to FIG. 3A and FIG. 3B, a distribution of the current-voltage relationships of the thin-film transistors manufactured using the exemplary embodiment of the present invention is smaller than a distribution of the current-voltage relationships of the thin-film transistors manufactured using the conventional method. Thus, electrical properties are more uniform for thin-film transistors manufactured using the method for forming a metal line according to the exemplary embodiment of the present invention.

Figure 4A:
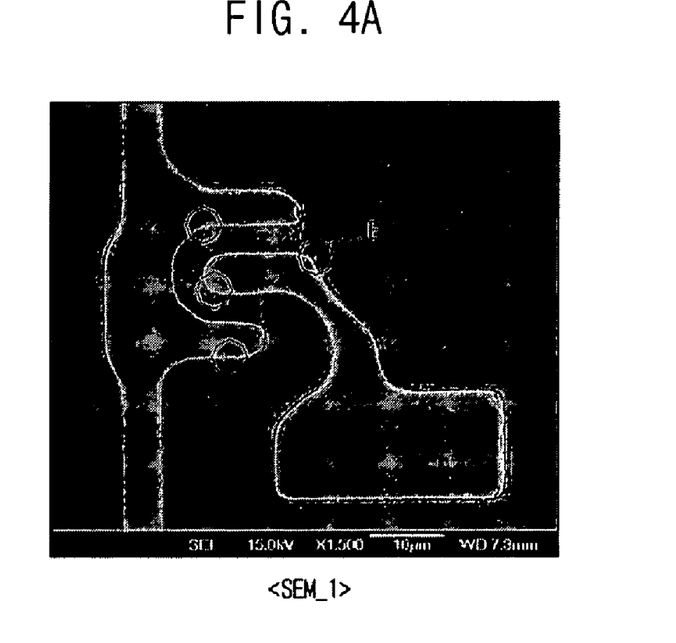
FIG. 4A is a scanning electron microscope (SEM) picture of a metal line manufactured using a conventional method.
Figure 4B:
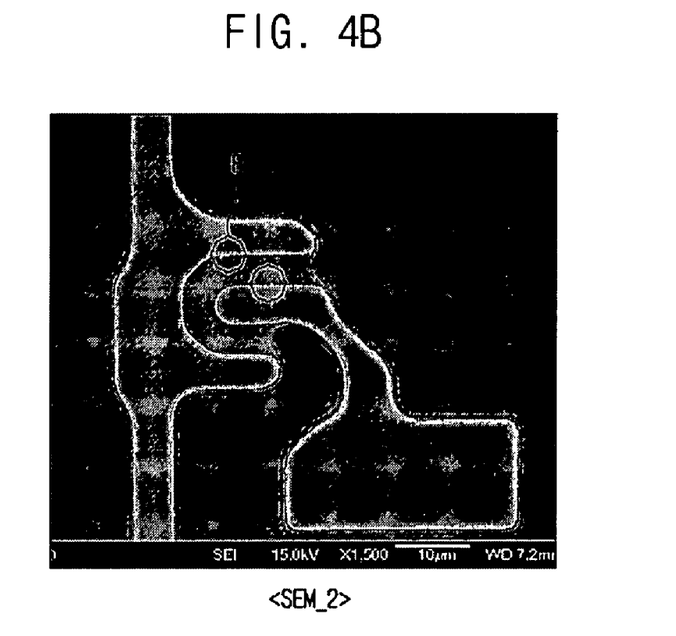
FIG. 4B is an SEM picture of a metal line manufactured using a method for forming a metal line according to an exemplary embodiment of the present invention.

FIG. 4A and FIG. 4B are scanning electron microscope (SEM) pictures of metal lines.

FIG. 4A is an SEM picture SEM_1 of a metal line manufactured using a conventional method. A first metal layer including a low-resistance metal was etched using a mixture of chlorine gas and boron trichloride gas as an etching gas to form the metal line.

FIG. 4B is an SEM picture SEM_2 of a metal line manufactured using a method for forming a metal line according to an exemplary embodiment of the present invention. A first metal layer including a low-resistance metal was etched using a mixture of chlorine gas and argon gas as an etching gas to form the metal line.

Referring to FIG. 4A and FIG. 4B, the metal line manufactured using the method for forming a metal line according to the exemplary embodiment of the present invention has fewer defects E than the metal line manufactured by the conventional method. Thus, it can be noted that defects may be reduced in a metal line manufactured using the method for forming a metal line according to the exemplary embodiment of the present invention.

Method for Manufacturing a Display Substrate

Figure 5:
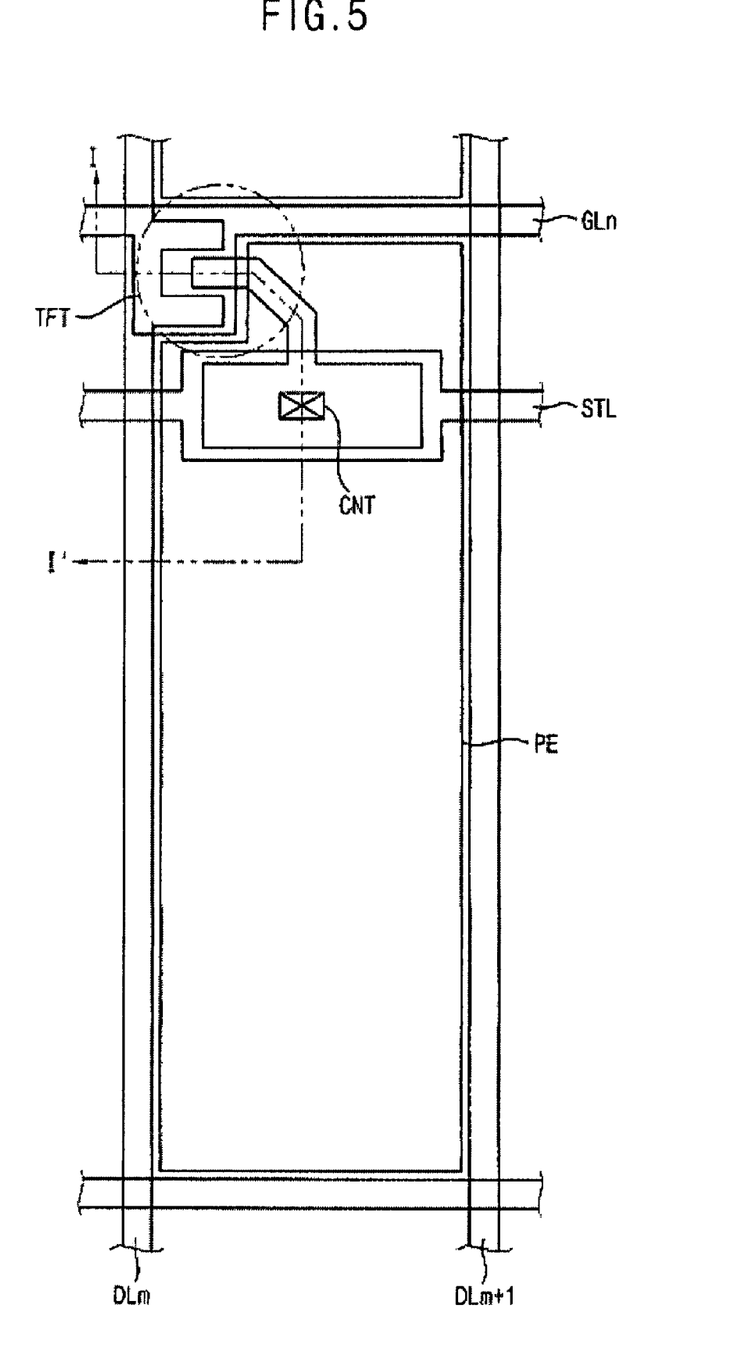
FIG. 5 is a plan view illustrating a display substrate manufactured by a method for manufacturing a display substrate according to another exemplary embodiment of the present invention.

FIG. 5 is a plan view illustrating a display substrate manufactured by a method for manufacturing a display substrate according to another exemplary embodiment. FIG. 6A, FIG. 6B, FIG. 7A, FIG. 7B, FIG. 7C, FIG. 7D, FIG. 8, and FIG. 9 are cross-sectional views taken along line I-I' of FIG. 5 illustrating a method for manufacturing a display substrate according to another exemplary embodiment.

Figure 6A:
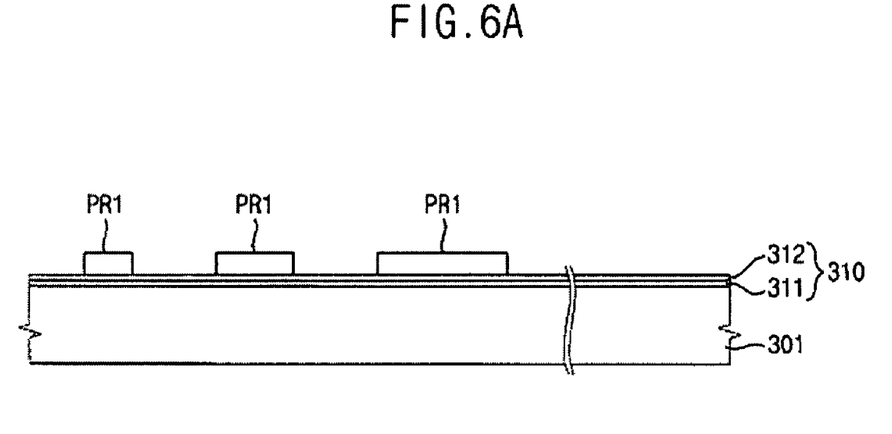
FIG. 6A, FIG. 6B, FIG. 7A, FIG. 7B, FIG. 7C, FIG. 7D, FIG. 8, and FIG. 9 are cross-sectional views taken along line I-I' of FIG. 5 illustrating a method for manufacturing a display substrate according to another exemplary embodiment of the present invention.
Figure 6B:
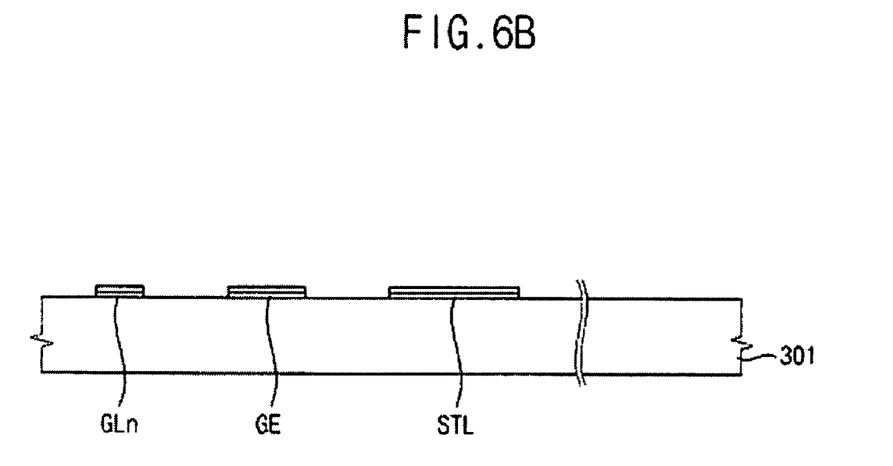

Particularly, FIG. 6A and FIG. 6B illustrate an etching process using a first mask (not shown).

Referring to FIG. 5, FIG. 6A and FIG. 6B, a gate metal layer 310 is formed on a base substrate 301 through a process such as sputtering. The gate metal layer 310 may include, for example, a first metal layer 311 and a second layer 312 formed on the first metal layer 311. The first metal layer 311 may include a metal having a relatively low resistance, for example, aluminum and/or an alloy thereof. The second layer 312 may include molybdenum and/or an alloy thereof.

A first photoresist layer is formed on the gate metal layer 310, and the first photoresist layer is patterned using a first mask (not shown) to form a first photoresist pattern PR1. The gate metal layer 310 is etched using the first photoresist pattern PR1 to form a gate pattern including a gate line GLn, a gate electrode GE, and a storage common line STL.

The gate metal layer 310 may be etched through a wet-etching process and/or a dry-etching process. For example, an oxidized layer on the surface of the second layer 312, the second layer 312, an oxidized layer on the surface of the first metal layer 311, and the first metal layer 311 may be respectively etched under the first condition, the second condition, the third condition, and the fourth condition explained with reference to FIG. 1A, FIG. 1B, and FIG. 1C.

FIG. 7A, FIG. 7B, FIG. 7C, and FIG. 7D illustrate an etching process using a second mask.

Figure 7A:
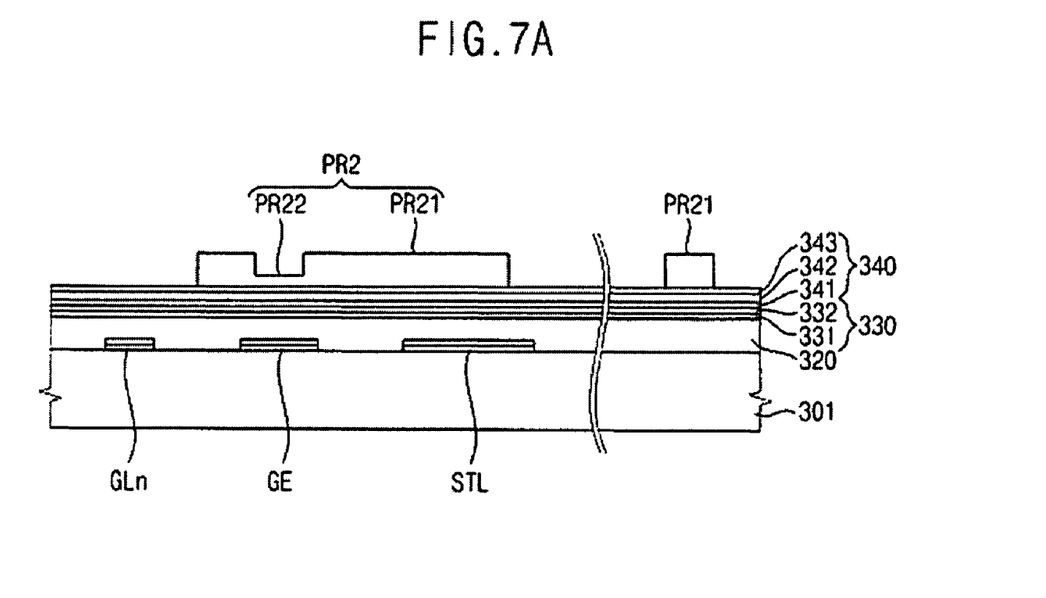

Referring to FIG. 5 and FIG. 7A, a gate insulation layer 320 and a semiconductor layer 330 are formed on the base substrate 301 shown in FIG. 6B through a plasma enhanced chemical vapor deposition (PECVD) method. The gate insulation layer 320 may include silicon nitride (SiNx). The semiconductor layer 330 may include an active layer 331 and an ohmic contact layer 332. The active layer 331 may include amorphous silicon (a-Si:H). The ohmic contact layer 332 may include amorphous silicon into which $n^+$ impurities are implanted at a high concentration.

A source metal layer 340 is formed on the ohmic contact layer 332. The source metal layer 340 has a triple layer including a third layer 341, a first metal layer 342, and a second layer 343, which are sequentially deposited. The third layer 341 may include molybdenum and/or an alloy thereof. The first metal layer 342 may include a metal having a relatively low resistance, for example, aluminum and/or an alloy thereof. The second layer 343 may include molybdenum and/or an alloy thereof.

A second photoresist layer is formed on the base substrate 301 having the source metal layer 340, and then patterned using a second mask (not shown) having a slit to form a second photoresist pattern PR2.

The second photoresist pattern PR2 includes a first photo pattern PR21 and a second photo pattern PR22. The first photo pattern PR21 may correspond to a source electrode SE, a drain electrode DE, and a source line DLm of a switching element TFT. The second photo pattern PR22 may correspond to a channel portion CH of the switching element TFT and may have a thickness that is less than a thickness of the first photo pattern PR21.

Figure 7B:
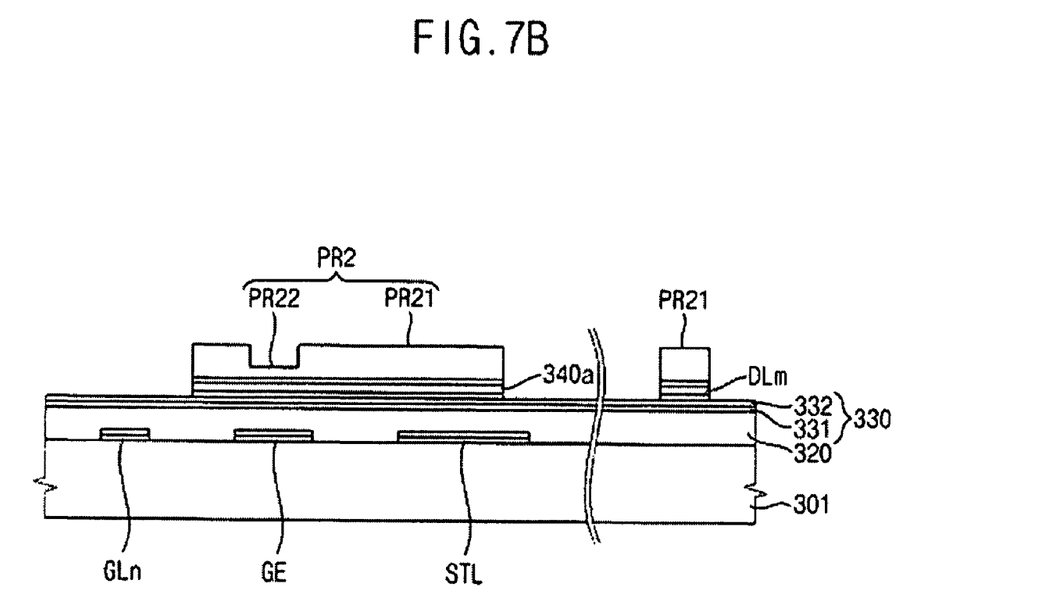

Referring to FIG. 5 and FIG. 7B, the source metal layer 340 is patterned using the second photoresist pattern PR2 to form a source pattern including an electrode pattern 340a and the source line DLm. The electrode pattern 340a may correspond to the source electrode SE and the drain electrode DE of the switching element TFT.

The source metal layer 340 may be etched through a wet-etching process to form the source pattern finer than a source pattern formed through a dry-etching process in the first condition, the second condition, the third condition, the fourth condition, and the fifth condition described above with reference to FIG. 1A, FIG. 1B, FIG. 1C, and FIG. 1D.

Figure 7C:
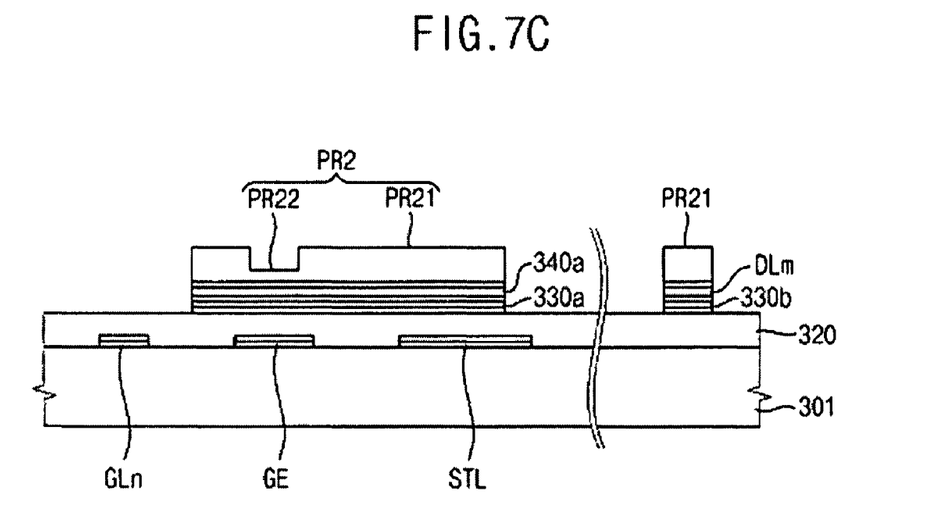
Figure 7D:
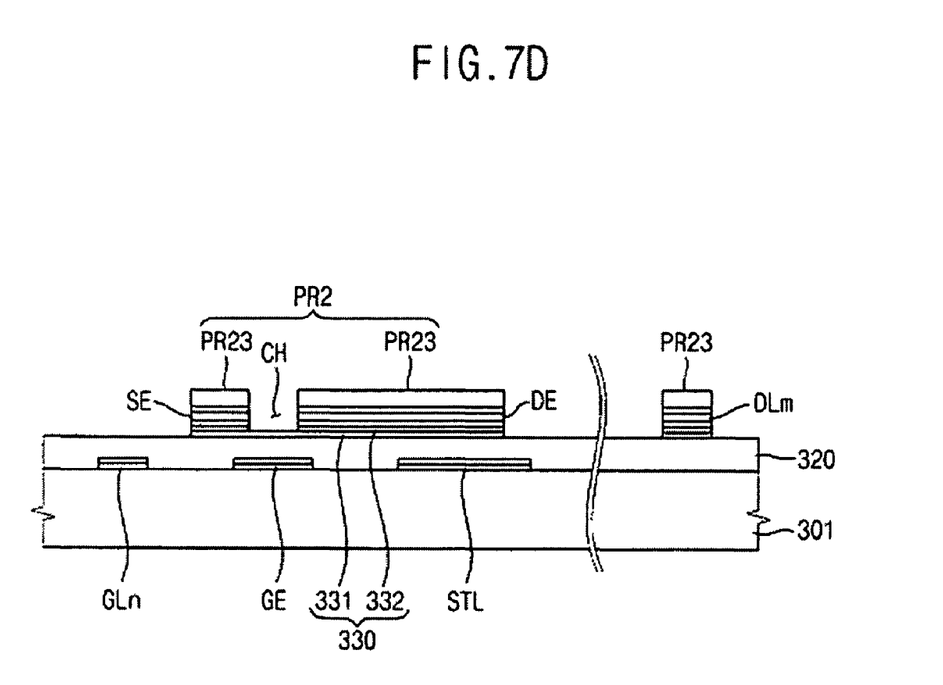

Referring to FIG. 5, FIG. 7C, and FIG. 7D, after the source pattern is formed, the semiconductor layer 330 is etched using the second photoresist pattern PR2 and the source pattern as a mask. Thus, semiconductor patterns 330a and 330b are formed under the source pattern.

Thereafter, an ashing process or an etch-back process may be performed to reduce a thickness of the second photoresist pattern PR2 by using an oxygen plasma discharge. Thus, a portion of the electrode pattern 340a, which may correspond to the channel portion CH of the switching element TFT, is exposed. A portion of the second photoresist pattern PR2 is removed to form a remaining pattern PR23 corresponding to the source electrode SE, the drain electrode DE, and the source line DLm.

An exposed portion of the electrode pattern 340a is etched using the remaining pattern PR23 as a mask.

The second layer 343 of the electrode pattern 340a is etched in the first condition and the second condition as explained above with reference to FIG. 1A and FIG. 1B. The first metal layer 342 of the electrode pattern 340a is etched in the third condition and the fourth condition as explained above with reference to FIG. 1C. Particularly, an oxidized layer formed on a surface of the first metal layer 342 is etched in the third condition in which a chamber pressure is about 15 mT, a source power is about 2,000 W and an etching gas includes a mixture of chlorine gas and boron trichloride gas. A volume ratio of the chlorine gas to the boron trichloride gas is about 0.20 to 1.00.

After the oxidized layer is removed, the first metal layer 342 is etched in the fourth condition in which a chamber pressure is about 10 mT to about 30 mT, a source power is about 1,000 W to about 2,000 W, a bias power is about 0 W to about 800 W and an etching gas includes a mixture of a chlorine-containing gas, for example, chlorine gas or hydrogen chloride (HCl) gas, and argon (Ar) gas or a mixture of chlorine gas and nitrogen ($N_2$) gas. A source power density with respect to a surface area of an electrode may be about 0.7 $W/cm^2$ to about 1.8 $W/cm^2$. A bias power density with respect to a surface area of an electrode may be about 0.7 $W/cm^2$ to about 1.8 $W/cm^2$. A volume ratio of argon gas or nitrogen gas to chlorine gas may be about 0.50 to about 1.50.

After the first metal layer 342 is etched, the third layer 341 of the electrode pattern 340a is etched in the fifth condition explained above with reference to FIG. 1D to form the source electrode SE and the drain electrode DE.

Next, an exposed portion of the ohmic contact layer 332 is etched through a dry-etching process by using the remaining pattern PR23 corresponding to the source electrode SE and the drain electrode DE as a mask. Thus, a channel portion CH having the active layer 331, a portion of which is exposed, is formed so that the switching element TFT is completed.

After the dry-etching process, chlorine ions from a chlorine-base etching gas may react with the first metal layer 342 including aluminum and/or an alloy thereof to remain on an exposed surface of the first metal layer 342. Therefore, a treatment process may be performed to remove the chlorine ions. Thus, risk of first metal layer 342 corrosion may be reduced. The treatment process may be performed in a condition substantially the same as a condition explained above with reference to FIG. 1D.

An ashing process may be performed to remove the remaining pattern PR23 as described above.

Figure 8:
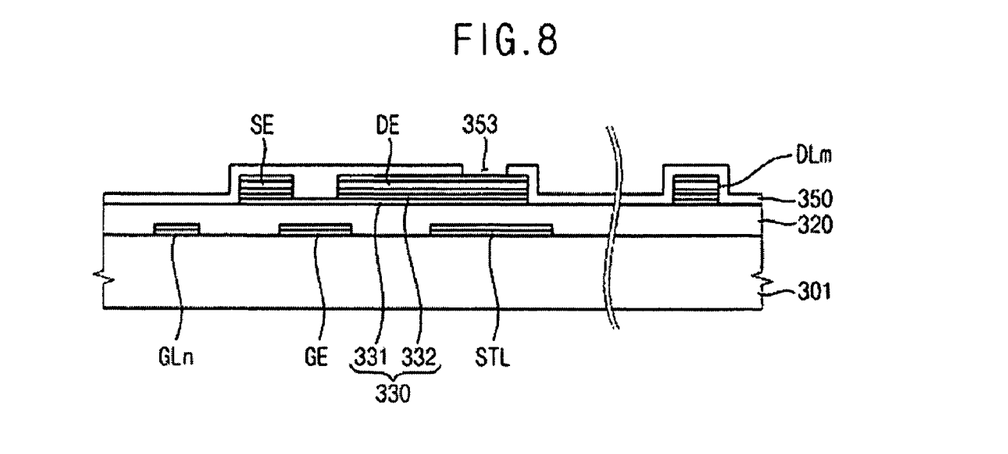
Figure 9:
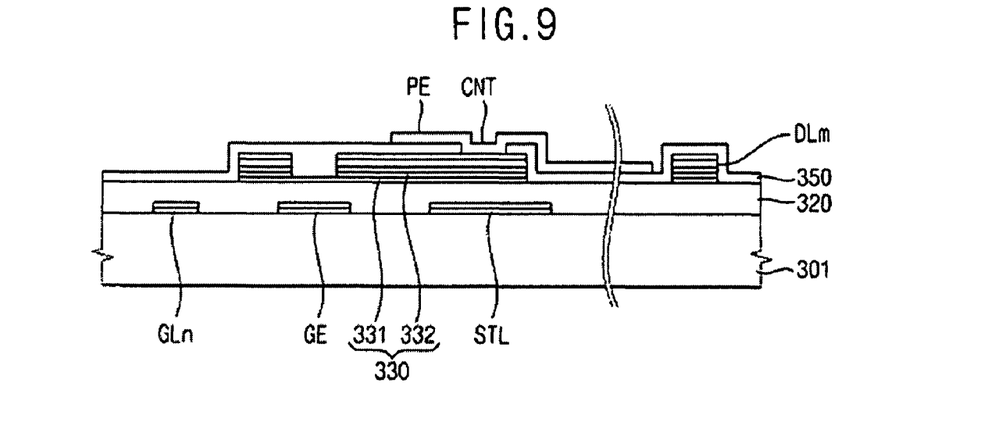

FIG. 8 illustrates an etching process using a third mask.
FIG. 9 illustrates an etching process using a fourth mask.

Referring FIG. 5, FIG. 8, and FIG. 9, a protection insulation layer 350 is formed on the base substrate 301 shown in FIG. 7D after the remaining pattern PR23 is removed. The protection insulation layer 350 may include silicon nitride. The protection insulation layer 350 is etched through a photolithography process using a third mask (not shown) to form a contact hole 353 exposing a portion of the drain electrode DE.

In this exemplary embodiment, the protection insulation layer 350 may include silicon nitride. Alternatively, the protection insulation layer 350 may be formed from an organic layer including, for example, an acryl-based polymer. Furthermore, the protection insulation layer 350 may be formed as a double layer including a silicon nitride layer and an organic layer.

A transparent conductive layer is formed on the protection insulation layer 350 having the contact hole 353. The transparent conductive layer may include, for example, indium tin oxide (ITO), or indium zinc oxide (IZO). Thus, the transparent conductive layer contacts the drain electrode DE through the contact hole 353. The transparent conductive layer is patterned using a fourth mask (not shown) to form a pixel electrode PE. The pixel electrode PE is electrically connected to the switching element TFT at a contact portion CNT.

FIG. 10, FIG. 11A, FIG. 11B, FIG. 12, and FIG. 13 are cross-sectional views taken along line I-I' of FIG. 5 illustrating a method for manufacturing a display substrate according to another exemplary embodiment of the present invention. Any further explanation concerning elements substantially similar or the same as the elements explained above will be omitted.

Figure 10:
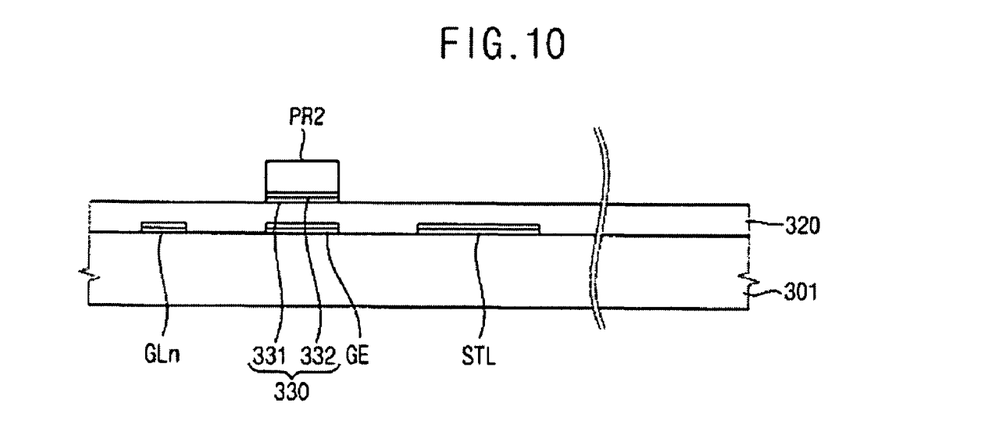
FIG. 10, FIG. 11A, FIG. 11B, FIG. 12, and FIG. 13 are cross-sectional views taken along line I-I' of FIG. 5 illustrating a method for manufacturing a display substrate according to another exemplary embodiment of the present invention.

FIG. 10 illustrates an etching process using a first mask and a second mask.

Referring to FIG. 5 and FIG. 10, a gate pattern including a gate line GLn, a gate electrode GE, and a storage common line STL is formed on a base substrate 301 by using a first mask (not shown). The gate pattern may have, for example, a double layer including a first metal layer 311 and a second layer 312 as shown in FIG. 6A and FIG. 6B. The first metal layer 311 may include aluminum and/or an alloy thereof. The second layer 312 may include molybdenum and/or an alloy thereof. The gate pattern may be etched through a dry-etching process and/or a wet-etching process. Particularly, the layers of the gate pattern may be etched in the first condition, the second condition, the third condition, and the fourth condition explained with reference to FIG. 1A, FIG. 1B, and FIG. 1C.

A gate insulation layer 320, an active layer 331, and an ohmic contact layer 332 are sequentially formed on the base substrate 301 having the gate pattern. A second photoresist pattern PR2 is formed on the ohmic contact layer 332. The active layer 331 and the ohmic contact layer 332 are etched using a second mask (not shown) to form a semiconductor layer 330 of a TFT. An ashing process may be performed to remove the second photoresist pattern PR2.

Figure 11A:
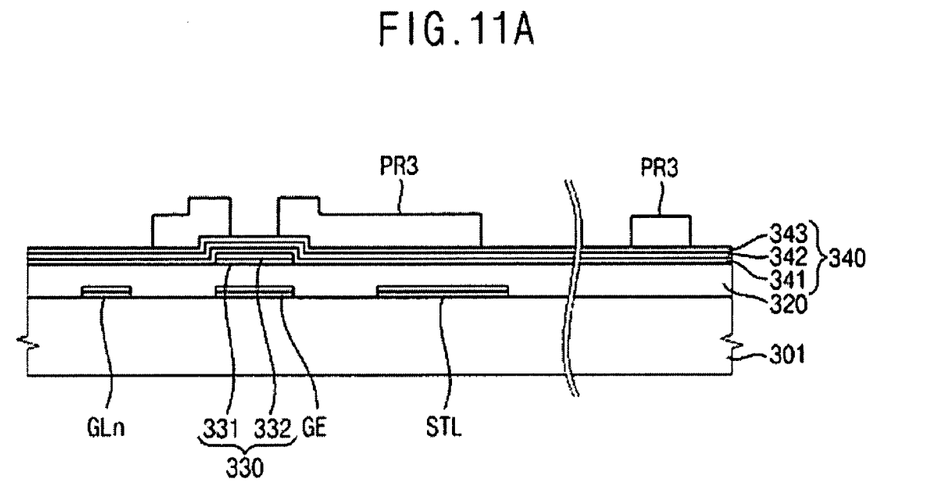
Figure 11B:
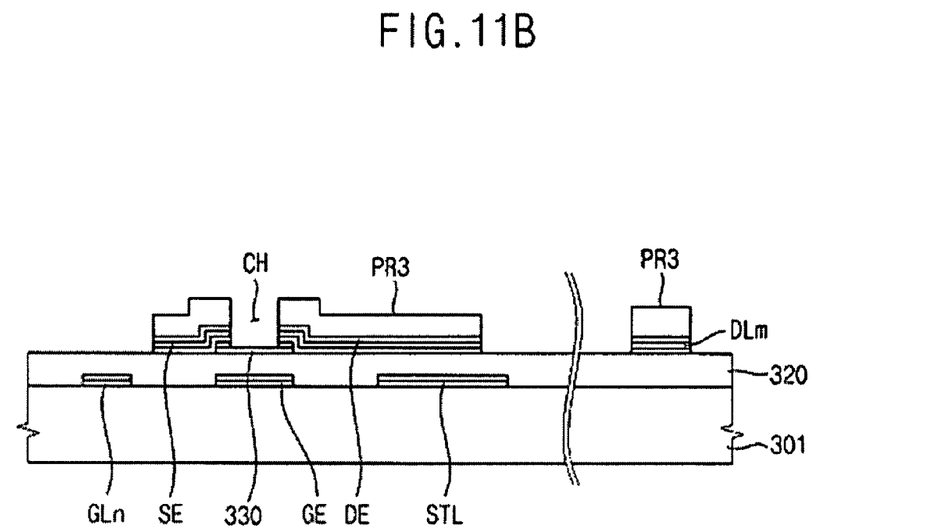

FIG. 11A and FIG. 11B illustrate an etching process using a third mask.

Referring to FIG. 5, FIG. 11A, and FIG. 11B, a source metal layer 340 is formed on the base substrate 301 shown in FIG. 10 after the second photoresist pattern PR2 has been removed. The source metal layer 340 has a triple layer including a third layer 341, a first metal layer 342, and a second layer 343, which are sequentially deposited. The third layer 341 includes molybdenum and/or an alloy thereof. The first metal layer 342 includes aluminum and/or an alloy thereof. The second layer 343 includes molybdenum and/or an alloy thereof.

A third photoresist pattern PR3 is formed on the source metal layer 340. The source metal layer 340 is etched using the third photoresist pattern PR3 as a mask to form a source pattern including a source electrode SE, a drain electrode DE, and a source line DLm. The source metal layer 340 is etched through a dry-etching process in the first condition, the second condition, the third condition, the fourth condition, and the fifth condition explained with reference to FIG. 1A, FIG. 1B, FIG. 1C, and FIG. 1D.

A channel portion CH is formed using the third photoresist pattern PR3 corresponding to the source electrode SE and the drain electrode DE as a mask. A treatment process is performed to prevent corrosion of the first metal layer 342 of the source pattern. An ashing process may be performed to remove the third photoresist pattern PR3.

Figure 12:
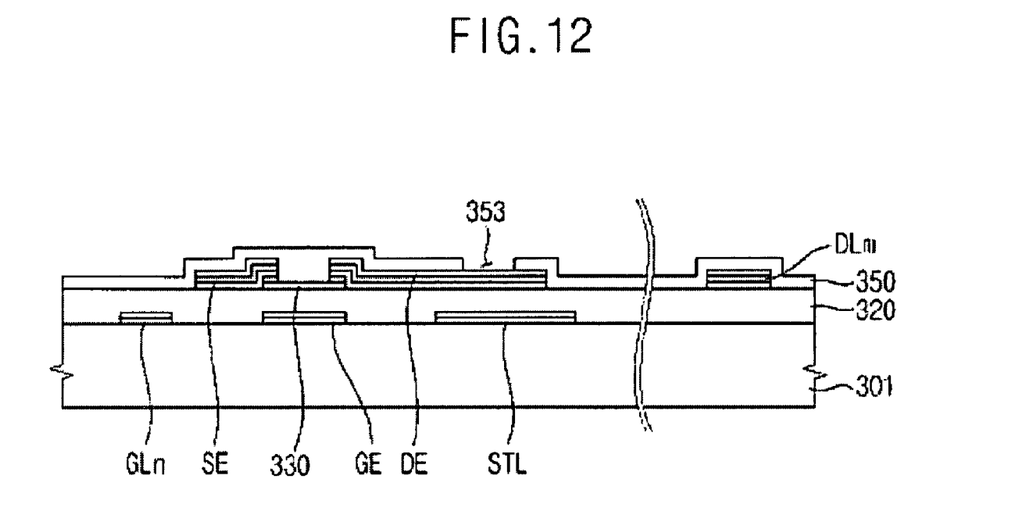
Figure 13:
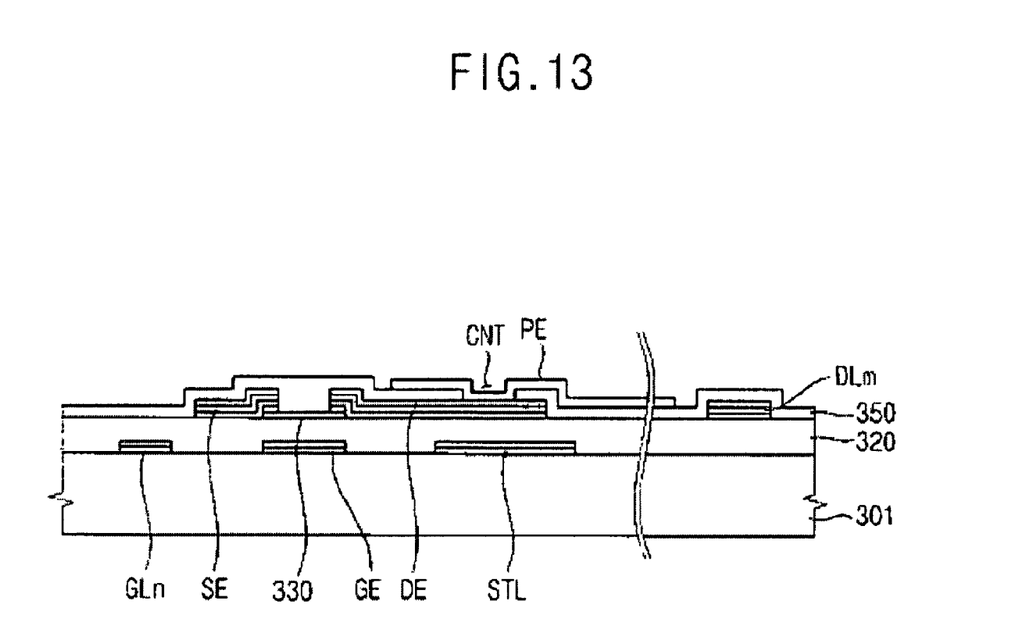

FIG. 12 and FIG. 13 illustrate an etching process using a fourth mask and a fifth mask.

Referring to FIG. 5, FIG. 12, and FIG. 13, a protection insulation layer 350 is formed on the base substrate 301 shown in FIG. 11B after the third photoresist pattern PR3 has been removed. The protection insulation layer 350 is etched using a fourth mask (not shown) to form a contact hole 353. A transparent conductive layer is formed on the protection insulation layer 350. The transparent conductive layer is etched using a fifth mask (not shown) to form a pixel electrode PE contacting the drain electrode DE through the contact hole 353. Thus, the pixel electrode PE is electrically connected to the switching element TFT at a contact portion CNT.

According to the above, a first metal layer having a metal having a relatively low resistance, for example, aluminum and/or an alloy thereof, is etched using a mixture of argon gas and a chlorine-containing gas, such as chlorine gas and/or hydrogen chloride gas, or a mixture of nitrogen gas and chorine-containing gas to improve an etching uniformity. Thus, uniformity of a TFT's layers may be improved. Furthermore, after the first metal layer is dry-etched, a risk of line defects caused by corrosion may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming a metal line, comprising:
    forming a first metal layer on a base substrate, the first metal layer comprising aluminum and/or aluminum alloy;
    forming a second metal layer on the first metal layer, the second metal layer comprising molybdenum and/or molybdenum alloy;
    forming a photoresist pattern having a line-shape on the second metal layer;
    etching the second metal layer with a first etching gas by using the photoresist pattern as a mask, the first etching gas comprising a mixture of a chlorine-containing gas and an oxygen gas; and
    etching the first metal layer with a second etching gas different from the first etching gas by using the photoresist pattern as a mask, the second etching gas comprising at least one of a mixture of a chlorine-containing gas and a nitrogen gas, or a mixture of a chlorine-containing gas and an argon gas.

2. The method of claim 1, wherein a volume ratio of the argon gas or the nitrogen gas to the chlorine-containing gas is about 0.5 to about 1.5.

3. The method of claim 2, wherein etching the first metal layer is performed at a chamber pressure of about 10 mT to about 30 mT, a source power density of about 0.7 W/cm$^2$ to about 1.8 W/cm$^2$, and a bias power density of about 0.7 W/cm$^2$ to about 1.8 W/cm$^2$.

4. The method of claim 1, further comprising:
    removing impurities from the base substrate after etching the first metal layer.

5. The method of claim 4, further comprising:
    forming a third metal layer on the base substrate, the third metal layer comprising molybdenum and/or molybdenum alloy,
    wherein the first metal layer is arranged between the second metal layer and the third metal layer.

6. The method of claim 5, further comprising:
    etching the third metal layer with the first etching gas before removing impurities.

7. The method of claim 4, wherein the impurities are removed using at least one of a water vapor or a hydrogen gas.

8. The method of claim 4, wherein the impurities are removed using a fluorine-containing gas.

9. A method for manufacturing a display substrate, comprising:
    forming a gate pattern on a base substrate, the gate pattern comprising a gate line and a gate electrode of a switching element;
    forming a gate insulation layer on the gate pattern;
    forming a source metal layer comprising first, second, and third metal layers on the gate insulation layer, the first metal layer comprising aluminum and/or aluminum alloy;
    etching the source metal layer to form a source electrode and a drain electrode of the switching element;
    forming a protection insulation layer comprising a contact hole exposing a portion of the drain electrode; and
    forming a pixel electrode contacting the drain electrode through the contact hole,
    wherein etching the source metal layer comprises:
        etching the second metal layer with a mixture of a chlorine-containing gas and an oxygen gas;
        etching the first metal layer with an etching gas; and
        etching the third metal layer with the mixture of the chlorine-containing gas and oxygen gas,
    wherein the etching gas comprises at least one of a mixture of a chlorine-containing gas and a nitrogen gas, or a mixture of a chlorine-containing gas and an argon gas.

10. The method of claim 9, wherein a volume ratio of the argon gas or the nitrogen gas to the chlorine-containing gas is about 0.50 to about 1.50.

11. The method of claim 10, wherein etching the source metal layer is performed at a chamber pressure of about 10 mT to about 30 mT, a source power density of about 0.7 W/cm$^2$ to about 1.8 W/cm$^2$, and a bias power density of about 0.7 W/cm$^2$ to about 1.8 W/cm$^2$.

12. The method of claim 9, wherein:
    the second and third metal layers layer both comprise molybdenum and/or molybdenum alloy,
    and the first metal layer is arranged between the second metal layer and the third metal layer.

13. The method of claim 12, wherein etching the source metal layer further comprises
    etching the source metal layer to form an electrode pattern and a source line crossing with the gate line.

14. The method of claim 13, wherein the electrode pattern and the source line are etched using a wet-etching process.

15. The method of claim 9, further comprising:
    removing impurities after the source electrode and the drain electrode are formed.

16. The method of claim 15, wherein the impurities are removed using at least one of water vapor or a hydrogen gas.

17. The method of claim 15, wherein the impurities are removed using a fluorine-containing gas.

* * * * *